(12) United States Patent
Hisamura

(10) Patent No.: US 9,915,869 B1
(45) Date of Patent: Mar. 13, 2018

(54) SINGLE MASK SET USED FOR INTERPOSER FABRICATION OF MULTIPLE PRODUCTS

(71) Applicant: Xilinx, Inc., San Jose, CA (US)

(72) Inventor: Toshiyuki Hisamura, San Jose, CA (US)

(73) Assignee: XILINX, INC., San Jose, CA (US)

( * ) Notice: Subject to any disclaimer, the term of this patent is extended or adjusted under 35 U.S.C. 154(b) by 394 days.

(21) Appl. No.: 14/321,591

(22) Filed: Jul. 1, 2014

(51) Int. Cl.
*G06F 17/00* (2006.01)
*G03F 7/00* (2006.01)

(52) U.S. Cl.
CPC .................. *G03F 7/0012* (2013.01)

(58) Field of Classification Search
USPC ........................................................ 716/55
See application file for complete search history.

(56) References Cited

U.S. PATENT DOCUMENTS

| | | |
|---|---|---|
| 4,467,342 A | 8/1984 | Tower |
| 4,803,595 A | 2/1989 | Kraus et al. |
| 5,285,236 A | 2/1994 | Jain |
| 5,399,898 A | 3/1995 | Rostoker |
| 5,437,946 A | 8/1995 | McCoy |
| 5,489,804 A | 2/1996 | Pasch |
| 5,715,144 A | 2/1998 | Ameen et al. |
| 5,787,007 A | 7/1998 | Bauer |
| 5,814,847 A | 9/1998 | Shihadeh et al. |
| 5,869,894 A | 2/1999 | Degani et al. |
| 5,897,986 A | 4/1999 | Dunn et al. |
| 5,907,903 A | 6/1999 | Ameen et al. |
| 6,157,213 A | 12/2000 | Voogel |
| 6,160,418 A | 12/2000 | Burnham |
| 6,204,689 B1 | 3/2001 | Percey et al. |
| 6,215,327 B1 | 4/2001 | Lyle |
| 6,216,257 B1 | 4/2001 | Agrawal et al. |
| 6,218,864 B1 | 4/2001 | Young et al. |
| 6,239,366 B1 | 5/2001 | Hsuan et al. |
| 6,288,772 B1 | 9/2001 | Shinozaki et al. |
| 6,359,466 B1 | 3/2002 | Sharpe-Geisler |
| 6,369,444 B1 | 4/2002 | Degani et al. |
| 6,396,303 B1 | 5/2002 | Young |
| 6,407,456 B1 | 6/2002 | Ball |
| 6,410,983 B1 | 6/2002 | Moriizumi et al. |
| 6,429,509 B1 | 8/2002 | Hsuan |

(Continued)

FOREIGN PATENT DOCUMENTS

EP        2151717 A1      2/2010

OTHER PUBLICATIONS

U.S. Appl. No. 13/535,102, filed Jun. 27, 2012, Camarota.

(Continued)

*Primary Examiner* — Mohammed Alam
(74) *Attorney, Agent, or Firm* — Orsen Bell; Robert M. Brush

(57) ABSTRACT

A method for fabricating an interposer wafer includes providing at least one mask having printing regions for forming a plurality of interposer designs; selecting an interposer design; and forming the interposer design on a substrate using a plurality of lithographic imaging steps. For each lithographic imaging step, at least one portion of the interposer design is printed by exposing at least one of the printing regions while blocking at least one other of the printing regions.

18 Claims, 9 Drawing Sheets

(56) References Cited

U.S. PATENT DOCUMENTS

| | | |
|---|---|---|
| 6,448,808 B2 | 9/2002 | Young et al. |
| 6,500,696 B2 | 12/2002 | Sutherland |
| 6,512,573 B2 | 1/2003 | Fürter |
| 6,525,407 B1 | 2/2003 | Drewery |
| 6,559,531 B1 | 5/2003 | Sutherland |
| 6,583,854 B1 | 6/2003 | Hazama et al. |
| 6,611,635 B1 | 8/2003 | Yoshimura et al. |
| 6,731,009 B1 | 5/2004 | Jones et al. |
| 6,734,553 B2 | 5/2004 | Kimura |
| 6,870,271 B2 | 3/2005 | Sutherland et al. |
| 6,930,378 B1 | 8/2005 | St. Amand et al. |
| 6,944,809 B2 | 9/2005 | Lai et al. |
| 6,972,487 B2 | 12/2005 | Kato et al. |
| 6,984,889 B2 | 1/2006 | Kimura |
| 6,992,395 B2 | 1/2006 | Fukasawa |
| 7,002,828 B2 | 2/2006 | Santin et al. |
| 7,028,281 B1 | 4/2006 | Agrawal et al. |
| 7,030,466 B1 | 4/2006 | Hsuan |
| 7,071,568 B1 | 7/2006 | St. Amand et al. |
| 7,087,989 B2 | 8/2006 | Nakayama |
| 7,088,134 B1 | 8/2006 | Agrawal et al. |
| 7,095,253 B1 | 8/2006 | Young |
| 7,098,542 B1 | 8/2006 | Hoang et al. |
| 7,107,565 B1 | 9/2006 | Lindholm et al. |
| 7,132,753 B1 | 11/2006 | St. Amand et al. |
| 7,181,718 B1 | 2/2007 | Bilski et al. |
| 7,187,200 B2 | 3/2007 | Young |
| 7,190,190 B1 | 3/2007 | Camarota et al. |
| 7,193,433 B1 | 3/2007 | Young |
| 7,196,543 B1 | 3/2007 | Young et al. |
| 7,199,610 B1 | 4/2007 | Young et al. |
| 7,202,697 B1 | 4/2007 | Kondapalli et al. |
| 7,202,698 B1 | 4/2007 | Bauer et al. |
| 7,205,790 B1 | 4/2007 | Young |
| 7,215,016 B2 | 5/2007 | Wang |
| 7,215,138 B1 | 5/2007 | Kondapalli et al. |
| 7,218,139 B1 | 5/2007 | Young et al. |
| 7,218,140 B1 | 5/2007 | Young |
| 7,218,143 B1 | 5/2007 | Young |
| 7,221,186 B1 | 5/2007 | Young |
| 7,230,329 B2 | 6/2007 | Sawamoto et al. |
| 7,233,168 B1 | 6/2007 | Simkins |
| 7,253,658 B1 | 8/2007 | Young |
| 7,256,612 B1 | 8/2007 | Young et al. |
| 7,265,576 B1 | 9/2007 | Kondapalli et al. |
| 7,268,587 B1 | 9/2007 | Pham et al. |
| 7,274,214 B1 | 9/2007 | Young |
| 7,276,934 B1 | 10/2007 | Young |
| 7,279,929 B1 | 10/2007 | Young |
| 7,284,226 B1 | 10/2007 | Kondapalli |
| 7,301,824 B1 | 11/2007 | New |
| 7,314,174 B1 | 1/2008 | Vadi et al. |
| 7,337,422 B1 | 2/2008 | Becker et al. |
| 7,345,507 B1 | 3/2008 | Young et al. |
| 7,402,443 B1 | 7/2008 | Pang et al. |
| 7,402,901 B2 | 7/2008 | Hatano et al. |
| 7,425,760 B1 | 9/2008 | Guenin et al. |
| 7,436,061 B2 | 10/2008 | Nakayama |
| 7,451,421 B1 | 11/2008 | Bauer et al. |
| 7,459,776 B1 | 12/2008 | St. Amand et al. |
| 7,491,576 B1 | 2/2009 | Young et al. |
| 7,498,192 B1 | 3/2009 | Goetting et al. |
| 7,859,119 B1 | 12/2010 | St. Amand et al. |
| 7,906,852 B2 | 3/2011 | Nishimura et al. |
| 7,999,383 B2 | 8/2011 | Hollis |
| 8,001,511 B1 | 8/2011 | Bauer et al. |
| 8,062,968 B1 | 11/2011 | Conn |
| 8,072,057 B2 | 12/2011 | Matsumura |
| 8,080,874 B1 | 12/2011 | Werner et al. |
| 8,097,957 B2 | 1/2012 | Chen et al. |
| 8,163,600 B2 | 4/2012 | Chow et al. |
| 8,227,904 B2 | 7/2012 | Braunisch et al. |
| 8,237,289 B2 | 8/2012 | Urakawa |
| 8,274,794 B2 | 9/2012 | Huang et al. |
| 8,295,056 B2 | 10/2012 | Andry et al. |
| 8,338,963 B2 | 12/2012 | Haba et al. |
| 8,344,519 B2 | 1/2013 | Lu et al. |
| 8,415,783 B1 | 4/2013 | Rahman et al. |
| 8,704,364 B2 | 4/2014 | Banijamali |
| 8,704,384 B2 | 4/2014 | Wu et al. |
| 8,810,006 B2 | 8/2014 | Yu et al. |
| 8,869,088 B1* | 10/2014 | Camarota ........... G06F 17/5068 716/119 |
| 8,913,402 B1* | 12/2014 | Berg ................ H01L 21/76898 174/250 |
| 8,928,132 B2 | 1/2015 | Choi et al. |
| 2002/0024146 A1 | 2/2002 | Furusawa |
| 2002/0175421 A1 | 11/2002 | Kimura |
| 2003/0146510 A1* | 8/2003 | Chien ............... H01L 23/49827 257/738 |
| 2003/0183917 A1 | 10/2003 | Tsai et al. |
| 2004/0184250 A1 | 9/2004 | Wang |
| 2004/0195668 A1 | 10/2004 | Sawamoto |
| 2004/0195682 A1 | 10/2004 | Kimura |
| 2004/0227223 A1 | 11/2004 | Sawamoto |
| 2004/0262777 A1* | 12/2004 | Kim ..................... H01L 25/105 257/778 |
| 2005/0112614 A1 | 5/2005 | Cook et al. |
| 2005/0142852 A1* | 6/2005 | Asami ................ H01L 21/4846 438/624 |
| 2005/0166106 A1 | 7/2005 | Warren |
| 2005/0216802 A1 | 9/2005 | Warren |
| 2006/0001163 A1 | 1/2006 | Kolbehdari et al. |
| 2006/0017147 A1 | 1/2006 | Drost et al. |
| 2006/0099736 A1 | 5/2006 | Nagar et al. |
| 2006/0157866 A1 | 7/2006 | Le et al. |
| 2006/0220227 A1 | 10/2006 | Marro |
| 2006/0226527 A1 | 10/2006 | Hatano et al. |
| 2006/0226529 A1 | 10/2006 | Kato et al. |
| 2007/0023921 A1 | 2/2007 | Zingher et al. |
| 2007/0029646 A1 | 2/2007 | Voldman |
| 2007/0050738 A1* | 3/2007 | Dittmann ................ G06F 17/50 716/106 |
| 2007/0204252 A1 | 8/2007 | Furnish et al. |
| 2007/0210428 A1 | 9/2007 | Tan et al. |
| 2007/0231966 A1 | 10/2007 | Egawa |
| 2007/0278642 A1 | 12/2007 | Yamaguchi et al. |
| 2008/0179735 A1 | 7/2008 | Urakawa |
| 2009/0057919 A1 | 3/2009 | Lin et al. |
| 2009/0267238 A1 | 10/2009 | Joseph et al. |
| 2010/0181658 A1* | 7/2010 | Yamashita .......... H01L 23/3107 257/676 |
| 2010/0330741 A1 | 12/2010 | Huang et al. |
| 2011/0019368 A1 | 1/2011 | Andry et al. |
| 2011/0169171 A1 | 7/2011 | Marcoux |
| 2011/0180317 A1 | 7/2011 | Takahashi et al. |
| 2011/0254162 A1 | 10/2011 | Hollis |
| 2011/0316572 A1 | 12/2011 | Rahman |
| 2012/0019292 A1 | 1/2012 | Lu et al. |
| 2012/0020027 A1 | 1/2012 | Dungan et al. |
| 2012/0032342 A1 | 2/2012 | Min et al. |
| 2012/0124257 A1 | 5/2012 | Wu |
| 2012/0206889 A1 | 8/2012 | Norman |
| 2012/0301977 A1 | 11/2012 | Andry et al. |
| 2012/0319248 A1 | 12/2012 | Rahman |
| 2013/0020675 A1 | 1/2013 | Kireev et al. |
| 2013/0059402 A1* | 3/2013 | Jakob .................. H01L 25/0657 438/15 |
| 2013/0134553 A1 | 5/2013 | Kuo et al. |
| 2013/0252378 A1 | 9/2013 | Jeng et al. |
| 2013/0333921 A1* | 12/2013 | Hisamura .......... H01L 21/4846 174/250 |
| 2014/0049932 A1 | 2/2014 | Camarota |
| 2014/0070423 A1 | 3/2014 | Woychik et al. |
| 2014/0077391 A1 | 3/2014 | Kikuchi et al. |
| 2014/0084459 A1 | 3/2014 | Yue et al. |
| 2014/0182906 A1* | 7/2014 | Hu ..................... H01L 23/49827 174/258 |
| 2015/0115405 A1* | 4/2015 | Wu ........................ H01L 28/10 257/531 |

(56) References Cited

U.S. PATENT DOCUMENTS

2015/0332996 A1* 11/2015 Kuo ........................ H01L 23/00
                                                        257/676

OTHER PUBLICATIONS

Chi, Chun-Chuan et al., "Post-Bond Testing of 2.5D-SICs and 3D-SICs Containing a Passive Silicon Interposer Base," *Proc. of the 2011 IEEE International Test Conference*, Sep. 20, 2011, pp. 1-10, IEEE, Piscataway, New Jersey, USA.

* cited by examiner

US 9,915,869 B1

SINGLE MASK SET USED FOR INTERPOSER FABRICATION OF MULTIPLE PRODUCTS

TECHNICAL FIELD

Implementations of the present disclosure are generally related to the fabrication of semiconductor devices, and in particular, to a single mask set used for interposer wafer fabrication of multiple products.

BACKGROUND

Electronic devices, such as tablets, computers, copiers, digital cameras, smart phones, control systems and automated teller machines, among others, often employ electronic components such as dies that are connected by various interconnect components. The dies may include memory, logic or other integrated circuit (IC) device.

ICs may be implemented to perform specified functions. Example ICs include mask-programmable ICs, such as general purpose ICs, application specific integrated circuits (ASICs), and the like, and field programmable ICs, such as field programmable gate arrays (FPGAs), complex programmable logic devices (CPLDs), and the like.

ICs have become more "dense" over time, i.e., more logic features have been implemented in an IC. More recently, Stacked-Silicon Interconnect Technology ("SSIT") allows for more than one semiconductor die to be placed in a single package. SSIT ICs may be used to address increased demand for having various ICs within a single package. Conventionally, SSIT products are implemented using an interposer that includes an interposer substrate layer with through-silicon-vias (TSVs) and additional metallization layers built on top of the interposer substrate layer. The interposer provides connectivity between the IC dies and the package substrate. However, fabricating the interposer substrate layer with TSVs for the SSIT products is a complex process. This is due to the several fabrication steps necessary to form the interposer substrate layer with the TSVs that include: forming TSVs within the interposer substrate layer, performing backside thinning and chemical vapor deposition (CVD) or chemical mechanical planarization (CMP), and providing thin wafer handling.

Currently, each product adopting SSIT uses a top cell level design database and photomask to fabricate the interposer wafer. Thus, for each different product, there is additional overhead in terms of engineering time and cost spent to develop the interposer wafer for each product.

SUMMARY

Implementations of the present disclosure generally relate to a single mask set used for interposer fabrication of multiple products. A method and apparatus are provided which allow fabrication of interposer wafers for multiple devices using a single mask set. Additionally, the method and apparatus allow fabrication of larger, many layered devices, using multiple exposures of a single mask set.

In one implementation, a method for fabricating an interposer wafer is provided. The method generally includes providing at least one mask having printing regions for forming a plurality of interposer designs; selecting an interposer design; and forming the interposer design on a substrate using a plurality lithographic imaging steps. For each lithographic imaging step, at least one portion of the interposer design is printed by exposing at least one of the printing regions while blocking at least one other of the printing regions.

In another implementation, a method for fabricating an interposer wafer is provided. The method generally includes printing, in a first lithographic imaging step, at least one portion of an interposer design by exposing at least one printing region of at least one mask while blocking at least one other printing region. The method also includes printing, in a second lithographic imaging step, at least one additional portion of an interposer design by exposing at least one printing region of the at least one mask while blocking at least one other printing region.

In one implementation, an apparatus for fabricating an interposer wafer is provided. The apparatus generally includes a lithographic imaging system configured to form the interposer on a substrate using at least one mask having printing regions for forming a plurality of interposer designs. The lithographic imaging system includes a processor programmed to: select an interposer design; and form the interposer design on the substrate using a plurality of lithographic imaging steps. For each lithographic imaging step, at least one portion of the interposer design is printed by exposing at least one of the printing regions while blocking at least one other of the printing regions.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements of one implementation may be beneficially incorporated in other implementations.

DETAILED DESCRIPTION

Figure 1:
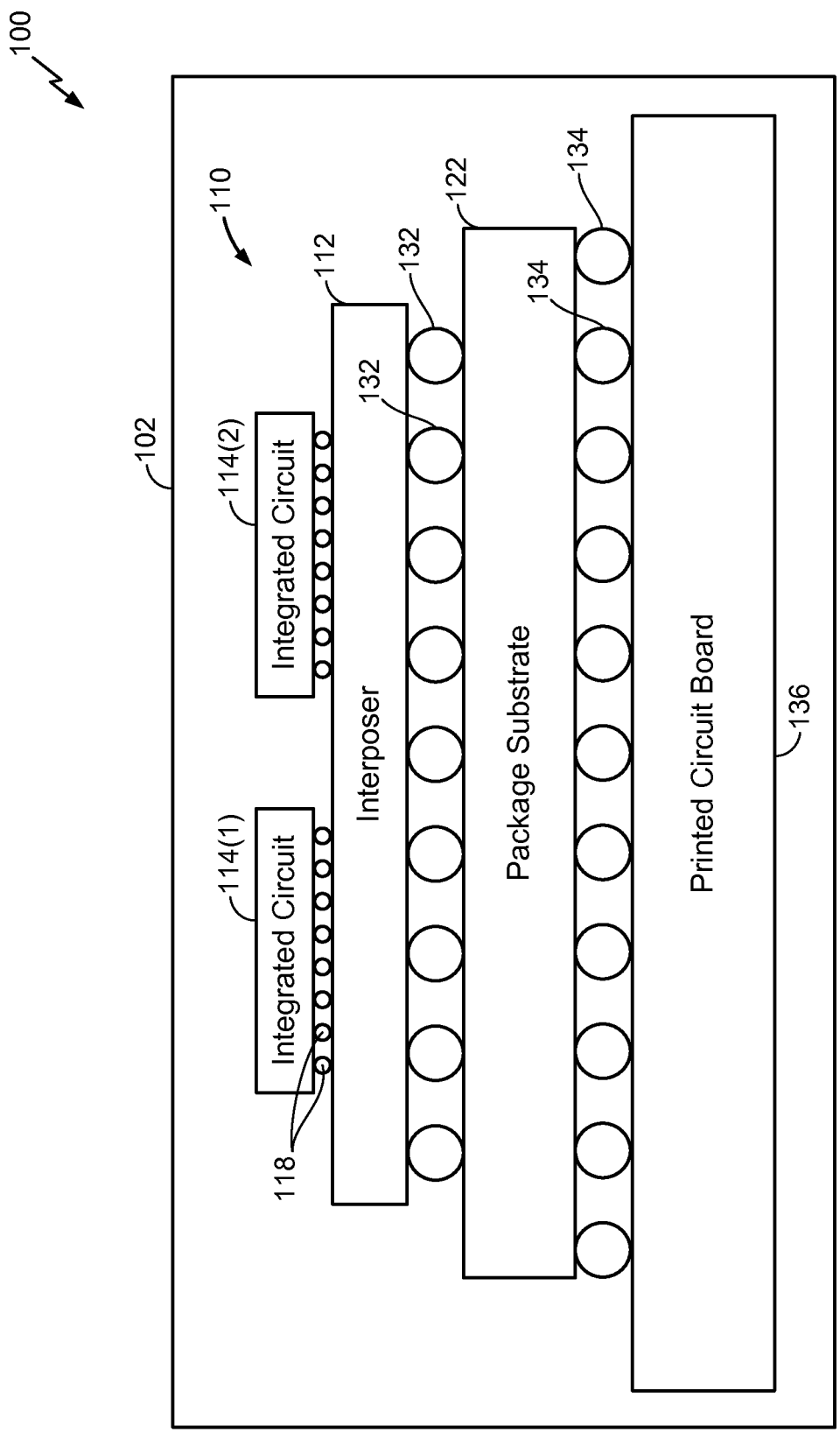
FIG. 1 is a cross-sectional schematic diagram illustrating an exemplary stacked silicon interconnect technology (SSIT) product that utilizes an interposer.

Aspects of the disclosure generally provide techniques and apparatus for fabrication of interposer wafers for multiple devices using a single mask set and for fabrication of larger, many layered devices, using multiple exposures of a single mask set.

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed disclosure or as a limitation on the scope of the claimed disclosure. In addition, an illustrated implementation need not have all the aspects or advantages shown. An aspect or an advantage described in conjunction with a particular implementation is not necessarily limited to that implementation and can be practiced in any other implementation even if not so illustrated.

Before describing exemplary implementations illustratively depicted in the several figures, a general introduction is provided to further understanding.

With the above general understanding borne in mind, various implementations for an interposer, as well as methodology for creating same, are generally described below. An interposer may be created using multistep imaging by effectively dividing the interposer into image slices ("slices") and lithographically stitching the slices together. Such multistep imaging may use a single mask for creating an interposer. By lithographic imaging using a mask with features, corresponding to more than one device, for lithographically stitching or interconnecting circuit slices of an interposer, multiple slices of a single mask may be imaged to create interposers for multiple devices.

An Example Silicon Stack Interconnect Technology (SSIT) Product

Silicon stacked interconnect technology (SSIT) involves packaging multiple integrated circuit (IC) dies into a single package that includes an interposer and a package substrate. Utilizing SSIT expands IC products, such as and including FPGA products and other types of products, into higher density, lower power, greater functionality, and application specific platform solutions with low cost and fast-to-market advantages.

FIG. 1 is a cross-sectional schematic diagram illustrating an exemplary SSIT product (electronic device 100) according to an example implementation. The electronic device 100 includes an integrated chip package 110 disposed in a housing 102. The electronic device 100 may be used in a computer, tablet, cell phone, smart phone, consumer appliance, control system, automated teller machine, programmable logic controller, printer, copier, digital camera, television, monitor, stereo, radio, radar, or other device.

The integrated chip package 110 includes a plurality of IC dies 114 (e.g., IC dies 114(1) and 114(2) are shown by example) connected optionally by a silicon-through-via (TSV) interposer 112 (also referred to as "interposer 112") to a package substrate 122. The chip package 110 may also have an overmold covering the IC dies 114 (not shown). The interposer 112 includes circuitry (not shown) for electrically connecting the IC dies 114 to circuitry (not shown) of the package substrate 122. The circuitry of the interposer 112 may optionally include transistors. Package bumps 132, also known as "C4 bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding or other suitable technique. The PCB 136 can be mounted in the interior of a housing 102 of the electronic device 100.

The IC dies 114 are mounted to one or more surfaces of the interposer 112, or alternatively, to the package substrate 122. The IC dies 114 may be programmable logic devices, such as FPGAs, memory devices, optical devices, processors or other IC logic structures. In the example depicted in FIG. 1, the IC dies 114 are mounted to a top surface of the interposer 112 by a plurality of micro-bumps 118. The micro-bumps 118 electrically connect the circuitry of each IC die 114 to circuitry of the interposer 112. The circuitry of the interposer 112 connects the micro-bumps 118 to package bumps 132, and hence, connects selective circuitry of each IC dies 114 to the package substrate 122, to enable communication of the IC dies 114 with the PCB after the chip package 110 is mounted within the electronic device 100. When the interposer 112 is not present, the micro-bumps 118 connect selective circuitry of each IC die 114 to the package substrate 122 to enable communication of the IC dies 114 with the PCB after the chip package 110 is mounted within the electronic device 100. Although not shown, it is contemplated that one or more additional IC dies may be stacked on one or both of the IC dies 114.

The electrical components of integrated chip package 110, such as the IC dies 114, communicate via traces formed on electrical interconnect components. The interconnect components having the traces can include one or more of the PCB 136, the package substrate 122 and interposer 112, among others components.

As mentioned, currently, each product adopting SSIT (e.g., similar to electronic device 100) uses a top cell level design database and photomask to fabricate the interposer wafer (e.g., similar to interposer 112). Thus, for each different product, there is additional overhead in terms of engineering time and cost spent to develop the interposer wafer for each product.

Example Single Mask Set Used for Interposer Fabrication of Multiple Products

Techniques are provided herein for utilizing lithography stepper's blade shuttering function and stitching of exposed different blocks on the wafer to enable use of a single mask to fabricate interposer wafers for multiple products. Using a single mask set of multiple products, as opposed to a different mask set for each product, may result in reduced engineering time and cost spent to develop interposer wafers of new products with similar architectures. In addition, the techniques provided herein may enable fabrication of interposer wafers with larger sizes and larger products, such as field programmable gate arrays (FPGAs).

Photolithography is a process used in microfabrication to pattern parts of a thin film or the bulk of a substrate. It uses light to transfer a geometric pattern from a photomask to a light-sensitive chemical "photoresist", or simply "resist," on the substrate. A series of chemical treatments then either engraves the exposure pattern into, or enables deposition of a new material in the desired pattern upon, the material underneath the photo resist. A photomask is an opaque plate with holes or transparencies that allow light to shine through in a defined pattern. Lithographic photomasks can be transparent fused silica blanks covered with a pattern defined with a chrome metal-absorbing film.

A set of photomasks, each defining a pattern layer in integrated circuit (IC) fabrication, is fed into a photolithography stepper or scanner, and individually selected for exposure. In photolithography for the mass production of IC devices (e.g., such as IC dies 114), a photomask may be referred to as a photoreticle or simply reticle.

A stepper is a device used in the manufacture of ICs that is similar in operation to a slide projector or a photographic enlarger. The stepper has a set of blades that mask off all but the selected region on the reticle. So a single reticle might have different items on it. The stepper's blades are used to define what gets exposed when the light shines through the reticle. As used in steppers and scanners, the reticle commonly contains only one layer of the chip. The pattern can be projected and shrunk by four or five times onto the wafer surface. To achieve complete wafer coverage, the wafer is repeatedly "stepped" from position to position under the optical column until full exposure is achieved. Elements of the circuit to be created on the IC are reproduced in a pattern of transparent and opaque areas on the surface of the photomask or reticle.

Using a technique called "stitching" and "pattern overlay," writing fields can be titled and patterns can be aligned to previously made ones by the stepper. As mentioned above, the stepper blade function the stitching techniques may be used to enable use of single mask for fabrication of multiple devices. It should be understood that an interposer, such as interposer 112, may have alignment marks places in scribe lanes. The alignment marks can be used to measure registration between two print images.

Figure 2:
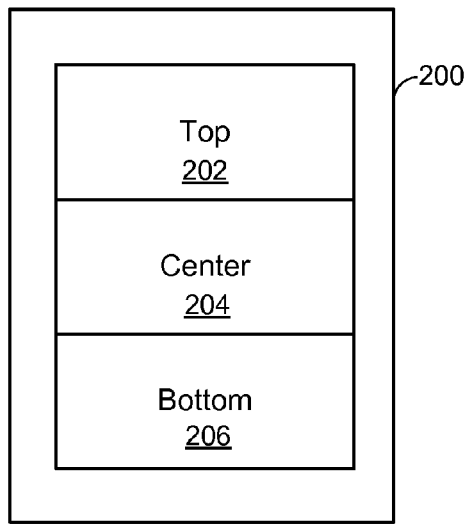
FIG. 2 illustrates an example interposer wafer for a device having three homogeneous active die slices.

FIG. 2 illustrates an example interposer wafer 200 for a device having active die three slices, according to an example implementation. As shown in FIG. 2, the interposer wafer 200 for a first device (e.g., a 7V1500T FPGA) may include three active die slices: a top slice 302, a center slice 204, and a bottom slice 206.

Figure 3:
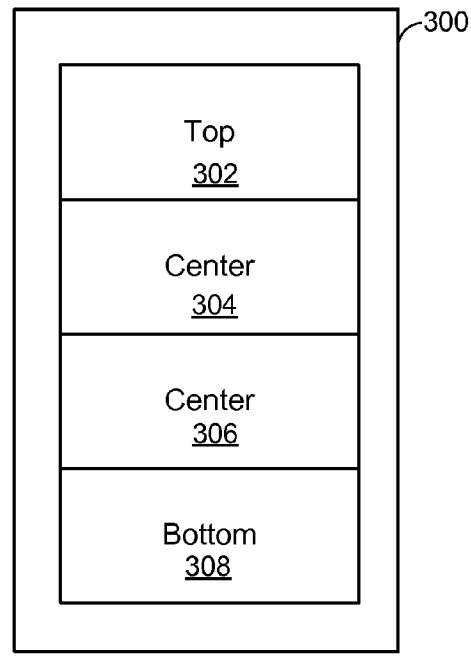
FIG. 3 illustrates an example interposer wafer for a device having four slices.

FIG. 3 illustrates an example interposer wafer 300 for a device having four slices, according to an example implementation. As shown in FIG. 3, the interposer wafer 300 for a second device (e.g., a 7V2000T FPGA) may include four slices: a top slice 302, a first center slice 304, a second center slice 306, and bottom slice 308.

The first device and the second device may share a similar architecture. For example, top slice 202 may be the same as top slice 302, bottom slice 206 may be the same as bottom slice 308, and center slice 204 may be the same as center slice 304 and/or center slice 306. It should be noted that interposers for other devices may have any number of slices.

Conventionally, in order to fabricate the interposer wafer 200 for the first device and the interposer wafer 300 for the second device, at least two mask sets and two design databases are used, one for each different device. However, techniques and apparatus are provided herein for fabricating interposer wafers for multiple devices using only a single mask and design database.

Figure 4:
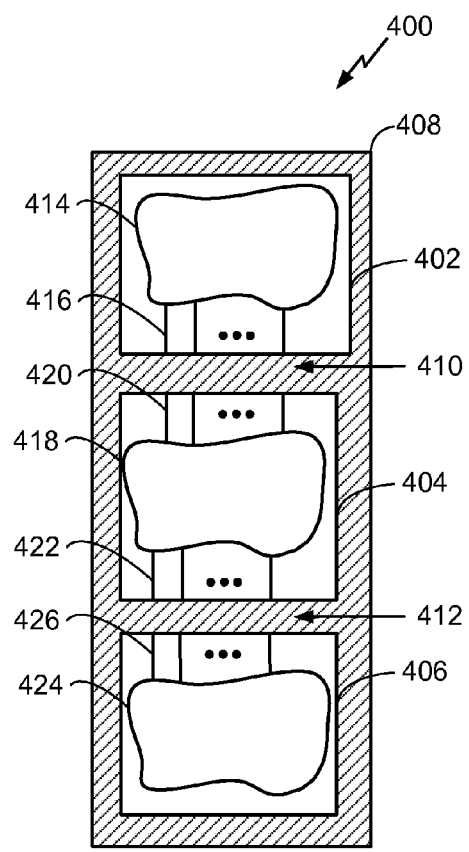
FIG. 4 is a block diagram depicting an exemplary mask having three printing regions.

FIG. 4 is a block diagram depicting an exemplary mask 400 having three printing regions, according to an example implementation. As shown in FIG. 4, mask 400 also includes a first light blocking region 408, a second light blocking region 410, and a third light blocking region 412. First light blocking region 408 may have an outer perimeter and an inner perimeter. First printing region 402, second light blocking region 410, second printing region 404, third light blocking region 412, and third printing region 406 may all be located within inner perimeter, where an uppermost edge of first printing region 402 borders a lower side of the inner perimeter and a lowermost edge of third printing region 406 borders an upper side of the inner perimeter. Second light blocking region 410 is disposed between first printing region 402 and second printing region 404. More particularly, the uppermost edge of second light blocking region 410 borders a lowermost edge of first printing region 402, and a lowermost edge of second light blocking region 410 borders an uppermost edge of second printing region 404. Third light blocking region 412 is disposed between second printing region 404 and third printing region 406. More particularly, the uppermost edge of third light blocking region 412 borders a lowermost edge of second printing region 404, and a lowermost edge of third light blocking region 412 borders an uppermost edge of third printing region 406.

First printing region 402 includes an image for lithographic imaging ("printing") of a first circuit portion (e.g., a top slice), which in this exemplary implementation includes a circuit module 414 and conductive lines 416 coupled thereto. Second printing region 404 includes an image for lithographic imaging of a second circuit portion (e.g., a center slice), which in this exemplary implementation includes a circuit module 418 and conductive lines 420 and 422 coupled thereto. Third printing region 406 includes an image for lithographic imaging of a third circuit portion (e.g., a bottom slice), which in this exemplary implementation includes a circuit module 424 and conductive lines 426 coupled thereto.

Conductive lines 416 and 420 may be used to interconnect the first circuit portion and the second circuit portion and conductive lines 422 and 426 may be used to interconnect the second circuit portion and the third circuit portion. Along those lines, first printing region 402 may be for a first slice of an interposer, second printing region 404 may be for a second slice of an interposer, and third printing region 406 may be for a third slice of an interposer, where such first slice, second slice, and third slice may be interconnected to one another. Thus, first printing region 402, second printing region 404, and third printing region 406 may each be laid out so as to repetitively print those regions for interconnecting pairs of such regions. For this exemplary implementation, die seals may be located around the perimeters of first printing region 402, second printing region 404, and third printing region 406. However, it should be understood that even though only three printing regions are illustratively depicted, in other implementations more than three printing regions may be used. Furthermore, in other implementations more than three circuit portions may be used for providing an interposer. In other words, even though an interposer is shown as being created using three slices, in other implementations, more than three slices may be used.

In aspects, the mask 400 may be used to fabricate interposer wafers for multiple devices. For example, the mask 400 may be used to fabricate either interposer wafer 200 for the first device or interposer wafer 300 for the second device. For example, FIGS. 5-8 illustrate a process using the mask 400 to fabricate interposer wafer 200 for the first device and FIGS. 9-12 illustrate a processing using the mask 400 to fabricate interposer wafer 300 for the second device.

Figure 5:
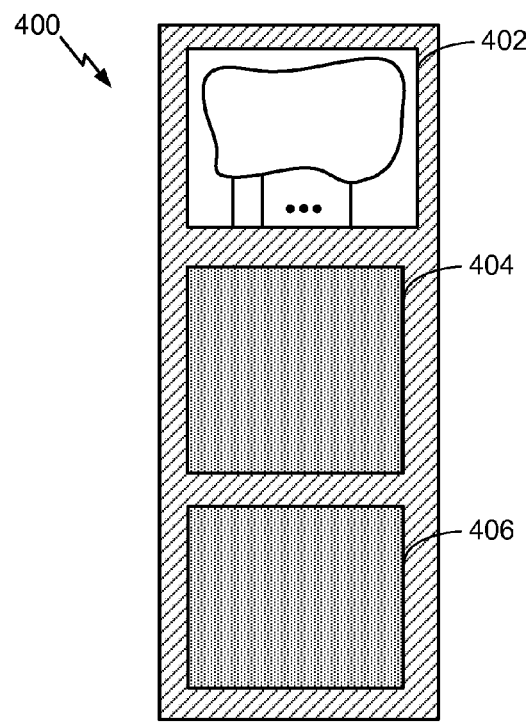
FIG. 5 is a block diagram of the mask of FIG. 4 with the second printing region and the third printing regions shuttered off.

FIG. 5 is a block diagram of the mask 400 of FIG. 4 with second printing region 404 and third printing region 406 shuttered off, according to an example implementation. In other words, mask 400 may be loaded in a lithographic scanner, and such lithographic scanner may be set to shutter off a portion of mask 400. In this exemplary implementation, mask 400 is illustratively depicted as having second printing region 404 and third printing region 406 shuttered off. Along those lines, the first printing region 402 defines an area of lithographic imaging onto a resist, such as photoresist for example, or other lithographically operative layer. Thus, a first circuit portion associated with first printing region 402 may be imaged onto such a resist.

Figure 6:
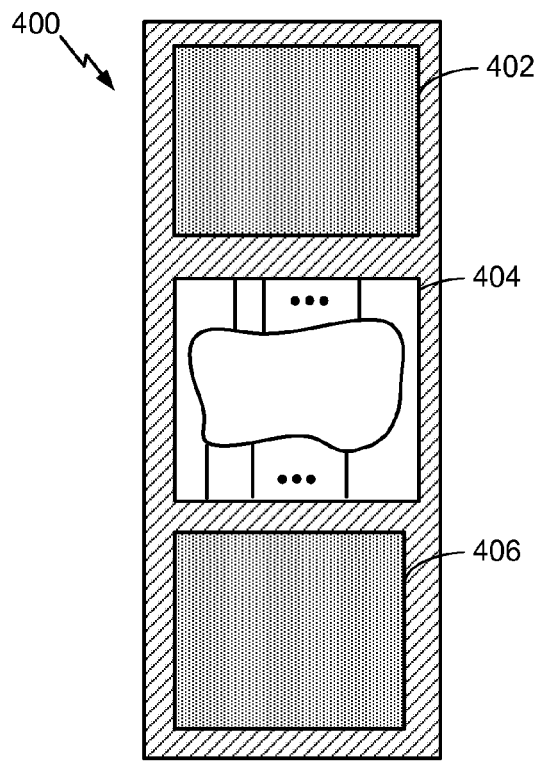
FIG. 6 is a block diagram of the mask of FIG. 4 with the first printing region and the third printing region shuttered off.

FIG. 6 is a block diagram of the mask 400 of FIG. 4 with first printing region 402 and third printing region 406 shuttered off, according to an example implementation. In other words, mask 400 may remain loaded in such a lithographic scanner, and such lithographic scanner may be reset to shutter off another portion of mask 400. In this exemplary implementation, mask 400 is illustratively depicted as having first printing region 402 and third printing region 406 shuttered off. This allows for less handling of mask 400, as mask 400 does not have to be removed and reloaded into a lithographic scanner for alternately imaging. Along those lines, the second printing region 404 defines an area of lithographic imaging onto a resist, such as photoresist for example, or other lithographically operative layer. Thus, a second circuit portion associated with second printing region 404 may be imaged onto such a resist.

Figure 7:
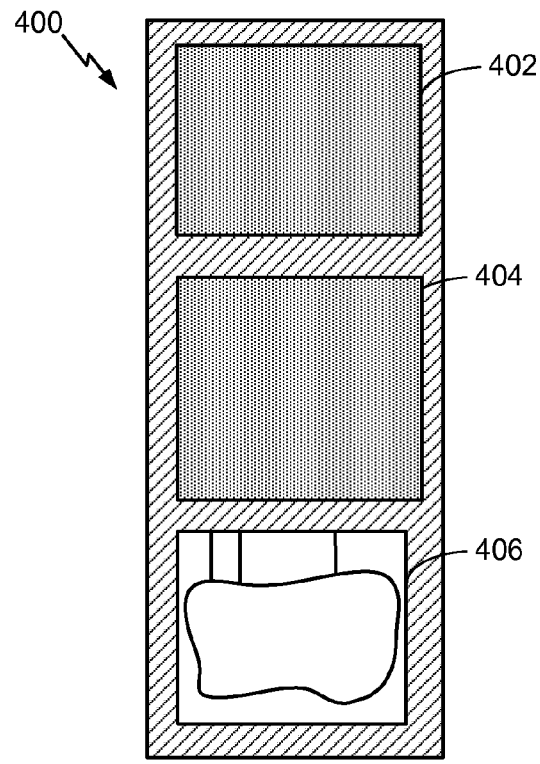
FIG. 7 is a block diagram of the mask of FIG. 4 with the first printing region and the second printing region shuttered off.

FIG. 7 is a block diagram of the mask 400 of FIG. 4 with first printing region 402 and second printing region 404 shuttered off, according to an example implementation. In other words, mask 400 may remain loaded in such a lithographic scanner, and such lithographic scanner may be reset to shutter off another portion of mask 400. In this exemplary implementation, mask 400 is illustratively depicted as having first printing region 402 and second printing region 404 shuttered off. This allows for less handling of mask 400, as mask 400 does not have to be removed and reloaded into a lithographic scanner for alternately imaging. Along those lines, the third printing region 406 defines an area of lithographic imaging onto a resist, such as photoresist for example, or other lithographically operative layer. Thus, a third circuit portion associated with third printing region 406 may be imaged onto such a resist.

Figure 8:
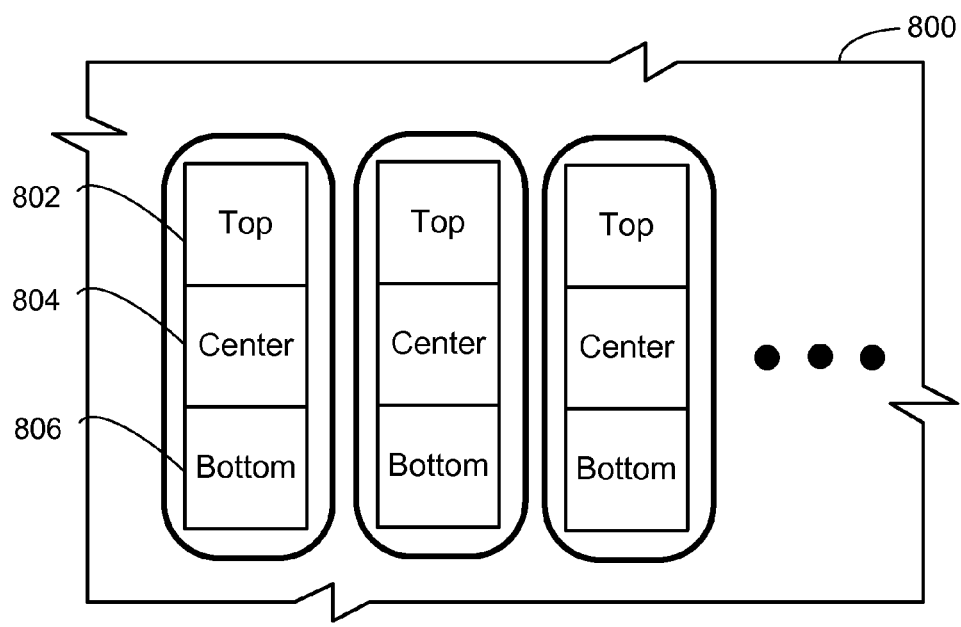
FIG. 8 illustrates a portion of a substrate having images printed thereon using the printing mask of FIG. 4 as shown in FIGS. 5-7.

FIG. 8 illustrates a portion of a substrate 800 having images 802, 804, 806 printed thereon using the mask 400 of FIG. 4 as shown in FIGS. 5-7, according to an example implementation. In aspects, image 802 may correspond to the first circuit portion imaged using the first printing region 402 of mask 400 with the second printing region 404 and third printing region 406 blocked, as shown in FIG. 5. Similarly, image 804 may correspond to the second circuit portion imaged using the second printing region 404 of mask 400 with the first printing region 402 and third printing region 406 blocked, as shown in FIG. 6. Similarly, image 806 may correspond to the third circuit portion imaged using the third printing region 406 of mask 400 with the first printing region 402 and second printing region 404 blocked, as shown in FIG. 7. In this manner, the interposer wafer 200 for the first device, shown in FIG. 2, may be fabricated using the mask 400.

In aspects, the imaging steps of FIGS. 5-7 could be performed in any order. In aspects, performing imaging in any order, so long as each one of the printing regions 402, 404, 406 are imaged, would still provide substrate 800 having images 802, 804, 806 printed thereon.

In aspects, the images may alternately be printed along a row onto substrate 800 while shuttering the other image. It should be understood that in a lithographic scanner, a scanner may have continuous or approximately continuous movement in a first direction for imaging while a mask is continuously or approximately continuously moved in a second direction opposite to such first direction. Along those lines, a row of images may be printed onto a resist layer on the substrate 800. In aspects, all of a first image may be printed in a row onto a resist layer on substrate 800 prior to printing any of the other images. In aspects, even though the above description was in terms of a lithographic scanner, it should be understood that other types of lithographic equipment may be used.

Figure 9:
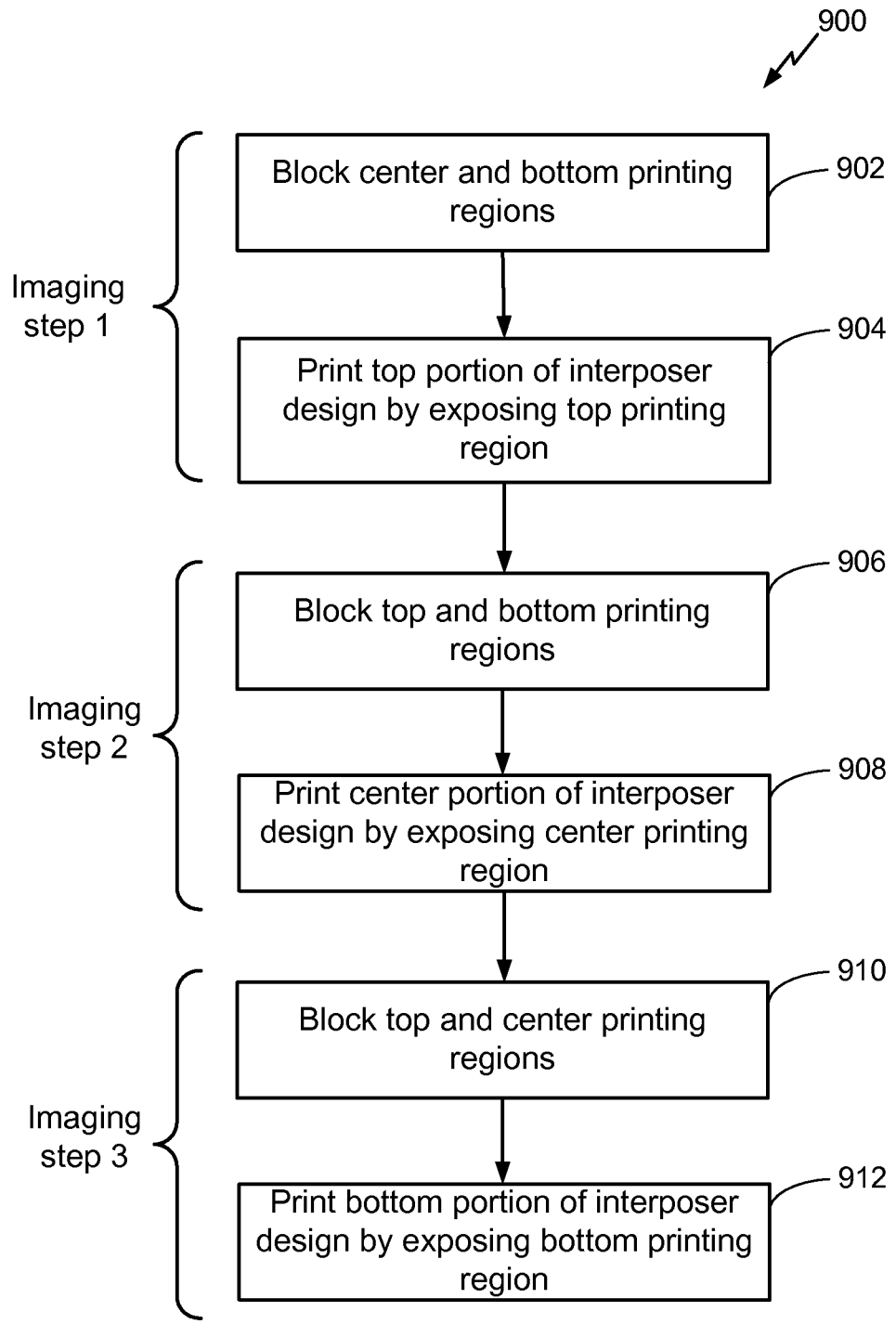
FIG. 9 is a flow diagram illustrating example lithographic imaging operations using a single mask for fabricating an interposer wafer for a device.

FIG. 9 is a flow diagram illustrating example lithographic imaging operations 900 using a single mask for fabricating an interposer wafer for a device, according to an example implementation. In aspects, the mask 400 may be imaged as shown in FIGS. 5-7 to fabricate the interposer wafer 200 on the substrate 800 for the first device. The lithographic imaging operations 900 may begin, at 902 with a first imaging step, by blocking a center printing region and a bottom printing region (for example, after the mask 400 and interposer wafer have been loaded into a lithographic scanner and for example, beginning at an end of a first row to be imaged onto the interposer wafer). For example, by blocking second printing region 404 and third printing region 406 of mask 400.

At 904, for the first imaging step, the top portion of an interposer design may be printed by exposing the top printing region. For example, first printing region 402 may be exposed to print images 802 substrate 800, for example to form first circuit portions on the wafer. In aspects, the printing may be repeated on the wafer, for example across a row or starting another row, with care taken to leave space for printing the bottom portion.

At 906, for a second imaging step, the top and bottom printing regions may be blocked. At 908, the center portion of interposer design may be printed by exposing the center printing region. For example, the second printing region 404 may be exposed to print the image 804 on substrate 800, for example to form the second circuit portion on the wafer. In aspects, image 804 may be stitched just below image 802.

At 910, for a third imaging step, the top and center printing regions may be blocked. At 912, the bottom portion of interposer design may be printed by exposing the bottom printing region. For example, the third printing region 406 may be exposed to print the image 806 on substrate 800, for example to form the third circuit portion on the wafer. In aspects, image 806 may be stitched just below image 804. Thus, the example lithographic imaging operations 900 may form images on the interposer wafer 200 as shown in FIG. 8 to fabricate the first device.

The above description of FIGS. 5-9 describe using mask 400 to fabricate the interposer wafer 200 for a first device. FIGS. 10-15 illustrate a different process using the same mask 400 to fabricate interposer wafer 300 for the second device.

Figure 10:
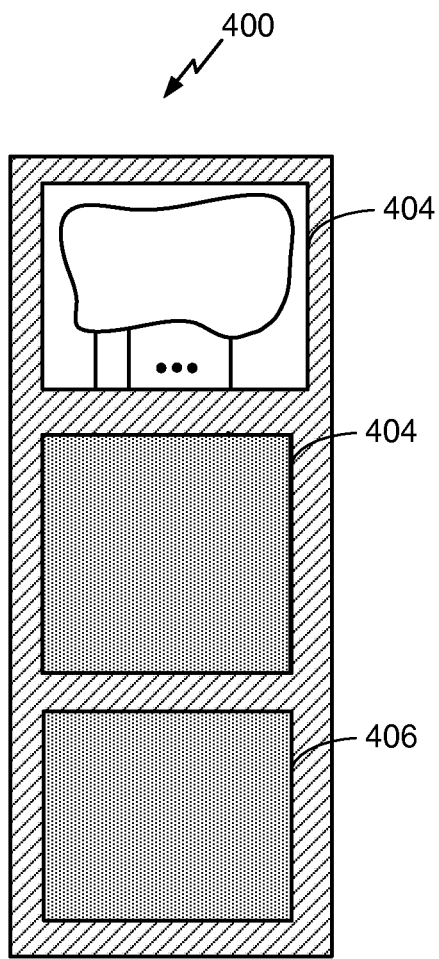
FIG. 10 is a block diagram of the mask of FIG. 4 with the second printing region and third printing region shuttered off.

FIG. 10 is a block diagram of the mask 400 of FIG. 4 with second printing region 404 and third printing region 406 shuttered off (blocked), according to an example implementation. In aspects, this is the same as illustrated in FIG. 5. In other words, mask 400 may be loaded in a lithographic scanner, and such lithographic scanner may be set to shutter off a portion of mask 400. In this exemplary implementation, mask 400 is illustratively depicted as having second printing 404 and third printing region 406 shuttered off. Along those lines, the first printing region 402 defines an area of lithographic imaging onto a resist, such as photoresist for example, or other lithographically operative layer. Thus, a first circuit portion associated with first printing region 402 may be imaged onto such a resist.

Figure 11:
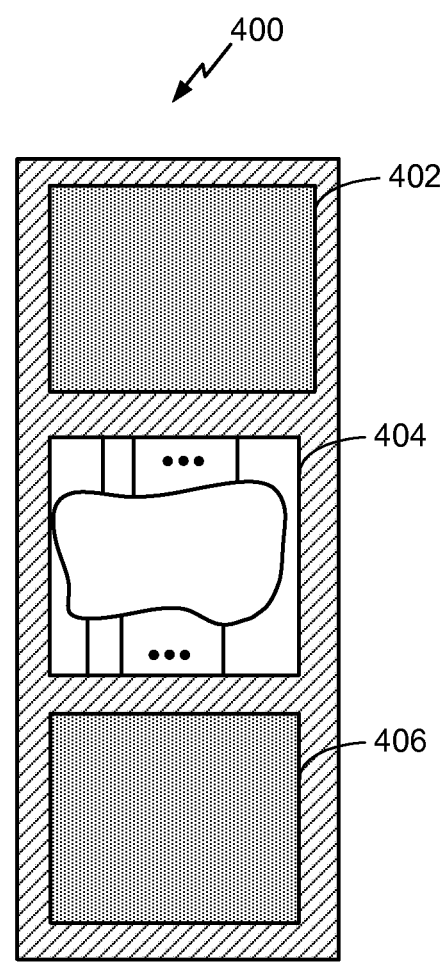
FIG. 11 is a block diagram of the mask of FIG. 4 with the first printing region and third printing region shuttered off.

FIG. 11 is a block diagram of the mask 400 of FIG. 4 with first printing region 402 and third printing region 406 shuttered off, according to an example implementation. In other words, mask 400 may remain loaded in such a lithographic scanner, and such lithographic scanner may be reset to shutter off another portion of mask 400. In this exemplary implementation, mask 400 is illustratively depicted as having first printing region 402 and third printing region 406 shuttered off. This allows for less handling of mask 400, as mask 400 does not have to be removed and reloaded into a lithographic scanner for alternately imaging. Along those lines, second printing region 404 defines an area of lithographic imaging onto a resist, such as photoresist for example, or other lithographically operative layer. Thus, a second circuit portion associated with second printing region 404 may be imaged onto such a resist.

Figure 12:
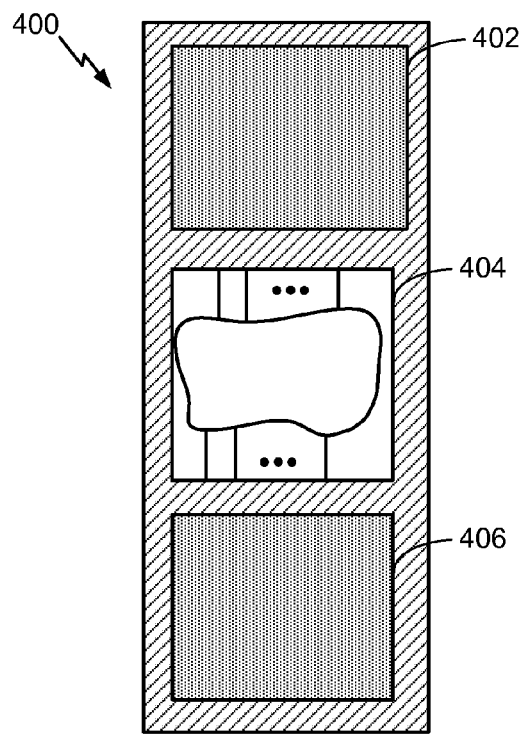
FIG. 12 is a block diagram of the mask of FIG. 4 with the first printing region and third printing region shuttered off.

FIG. 12 is a block diagram of the mask 400 of FIG. 4 with first printing region 402 and third printing region 406 shuttered off, according to an example implementation. In other words, mask 400 may remain loaded in such a lithographic scanner, and such lithographic scanner may be reset to shutter off the same portion of mask 400. Along those lines, second printing region 404 defines an area of lithographic imaging onto a resist, such as photoresist for example, or other lithographically operative layer. Thus, a third circuit portion also associated with second printing region 404 may be imaged again onto such a resist.

Figure 13:
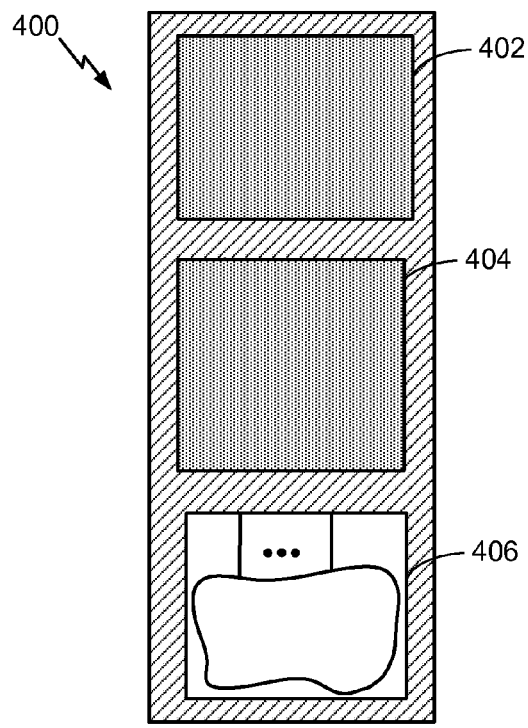
FIG. 13 is a block diagram of the mask of FIG. 4 with the first printing region and second printing region shuttered off.

FIG. 13 is a block diagram of the mask 400 of FIG. 4 with first printing region 402 and second printing region 404 shuttered off, according to an example implementation. In other words, mask 400 may remain loaded in such a lithographic scanner, and such lithographic scanner may be reset to shutter off another portion of mask 400. In this exemplary implementation, mask 400 is illustratively depicted as having first printing region 402 and second printing region 404 shuttered off. This allows for less handling of mask 400, as mask 400 does not have to be removed and reloaded into a lithographic scanner for alternately imaging. Along those lines, third printing region 406 defines an area of lithographic imaging onto a resist, such as photoresist for example, or other lithographically operative layer. Thus, a fourth circuit portion associated with third printing region 406 may be imaged onto such a resist.

Figure 14:
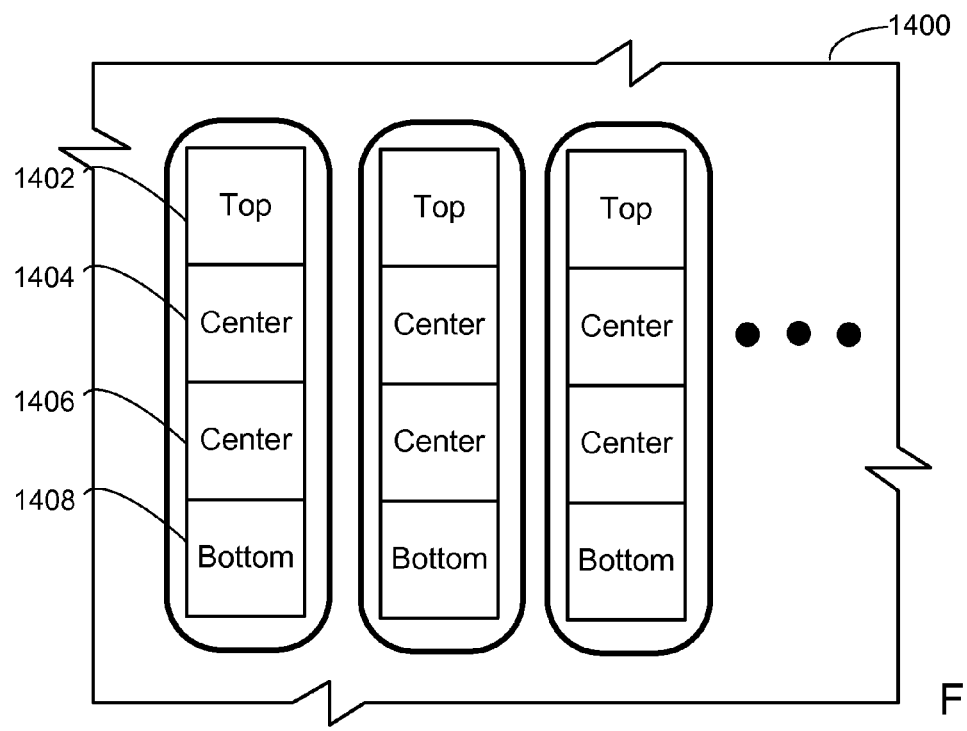
FIG. 14 illustrates a portion of a substrate having images printed thereon using the printing mask of FIG. 4 as shown in FIGS. 10-13.

FIG. 14 illustrates a portion of a substrate 1400 having images 1402, 1404, 1406, 1408 printed thereon using the printing mask 400 of FIG. 4 as shown in FIGS. 10-13, according to an example implementation. In aspects, image 1402 may correspond to the first circuit portion imaged using the first printing region 402 of mask 400 shuttered and imaged as shown in FIG. 10. Similarly, images 1404 and 1406 may correspond to the second and third circuit portion imaged using the second printing region 404 of mask 400 shuttered and imaged as shown in FIGS. 11 and 12, respectively. In aspects, image 1404 may be stitched just below image 1402 and image 1406 may be stitched just below image 1404. Similarly, image 1408 may correspond to the fourth circuit portion imaged using the third printing region 406 of mask 400 shuttered and imaged as shown in FIG. 13. In aspects, image 1408 may be stitched just below image 1406. In this manner, the interposer wafer 300 for the second device, shown in FIG. 3, may be fabricated using the printing mask 400.

In aspects, the imaging steps of FIGS. 10-13 could be performed in any order. In aspects, performing imaging in any order, so long as each one of the printing regions 402, 404, 406 are imaged with the second printing region 404 be imaged twice, would still provide substrate 1400 having images 1402, 1404, 1406, 1408 printed thereon.

In aspects, any number of second circuit portions (center portions) could be imaged using second printing region 404. In aspects, this may allow for interposer wafer fabrication for devices, for example FPGAs, of very large size.

In aspects, the images may alternately be printed along a row onto substrate 1400 while shuttering the other image. In aspects, a row of images may printed onto a resist layer on the substrate 1400. In aspects, all of a first image may be printed in a row onto a resist layer on substrate 1400 prior to printing any of the other images. In aspects, even though the above description was in terms of a lithographic scanner, it should be understood that other types of lithographic equipment may be used.

Figure 15:
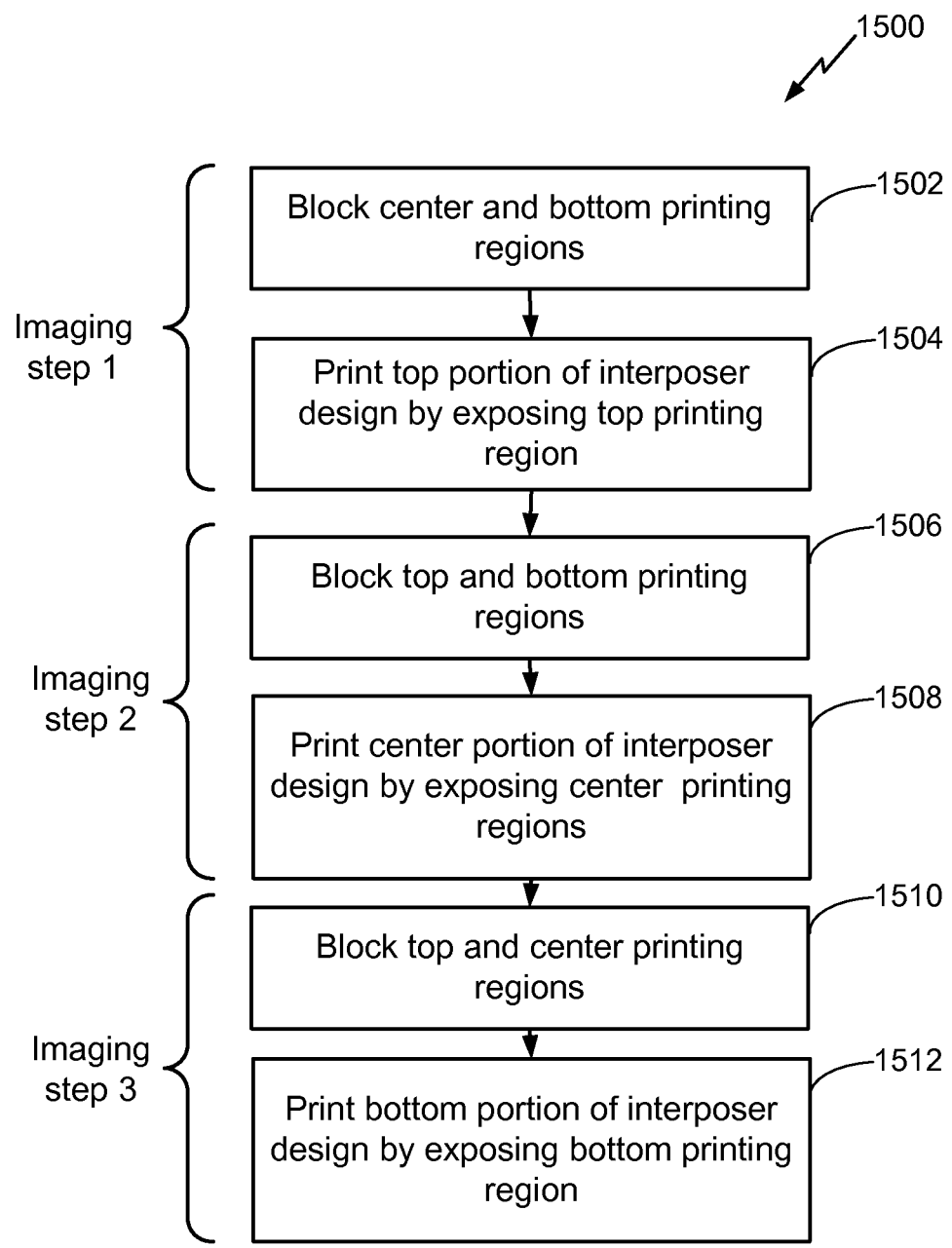
FIG. 15 is a flow diagram illustrating example lithographic imaging operations using a single mask for fabricating an interposer wafer for a device.

FIG. 15 is a flow diagram illustrating example lithographic imaging operations 1500 using a single mask for fabricating an interposer wafer for a device, according to an example implementation. In aspects, the mask 400 may be imaged as shown in FIGS. 10-13 to fabricate the interposer wafer 300 on the substrate 1400 for the second device. The lithographic imaging operations 1500 may begin, at 1502 with a first imaging step, by blocking a center printing region and a bottom printing region (for example, after the mask 400 and interposer wafer have been loaded into a lithographic scanner and for example, beginning at an end of a first row to be imaged onto the interposer wafer). For example, by blocking second printing region 404 and third printing region 406 of mask 400.

At 1504, for the first imaging step, the top portion of an interposer design may be printed by exposing the top printing region. For example, first printing region 402 may be exposed to print image 1402 on substrate 1400, for example to form the first circuit portion on the wafer. In aspects, the printing may be repeated on the wafer, for example across a row or starting another row, with care taken to leave space for printing the bottom portion.

At 1506, for a second imaging step, the top printing region and bottom printing region may be blocked. At 1508, a center portion of the interposer design may be printed by exposing the center printing region. For example, second printing region 404 may be exposed to print image 1404 on substrate 1400, for example to form the second circuit portion on the wafer.

In aspects, the second imaging step may be repeated any number of times in order to print a desired number of second circuit portions on the wafer. For example, the second imaging step may be performed at least a second time in order to print image 1406 on substrate 1400, for example to form another second circuit portion on the wafer.

In aspects, for each lithographic imaging step, features (e.g., conductors or die seal ring) of at least one portion of the interposer design are interconnected with features of at least one other portion of the interposer design.

At 1510, for a third imaging step, the top printing region and center printing region may be blocked. At 1512, a bottom portion of the interposer design may be printed by exposing the bottom printing region. For example, third printing region 406 may be exposed to print image 1408 on substrate 1400, for example to form the third circuit portion on the wafer. Thus, the example operations 1500 may form images on the interposer wafer 300 as shown in FIG. 14 to fabricate the second device.

As mentioned above, a single mask may be used to fabricate an interposer of variable size based on the number of center slice exposures, according to an example implementation. For example, mask 400 with three slices may be used. By exposing additional center slices and stitching the center slices between a top slice and a bottom slice, a desired number of second circuit portions may be printed for fabrication of an FPGA of desired size.

Figure 16:
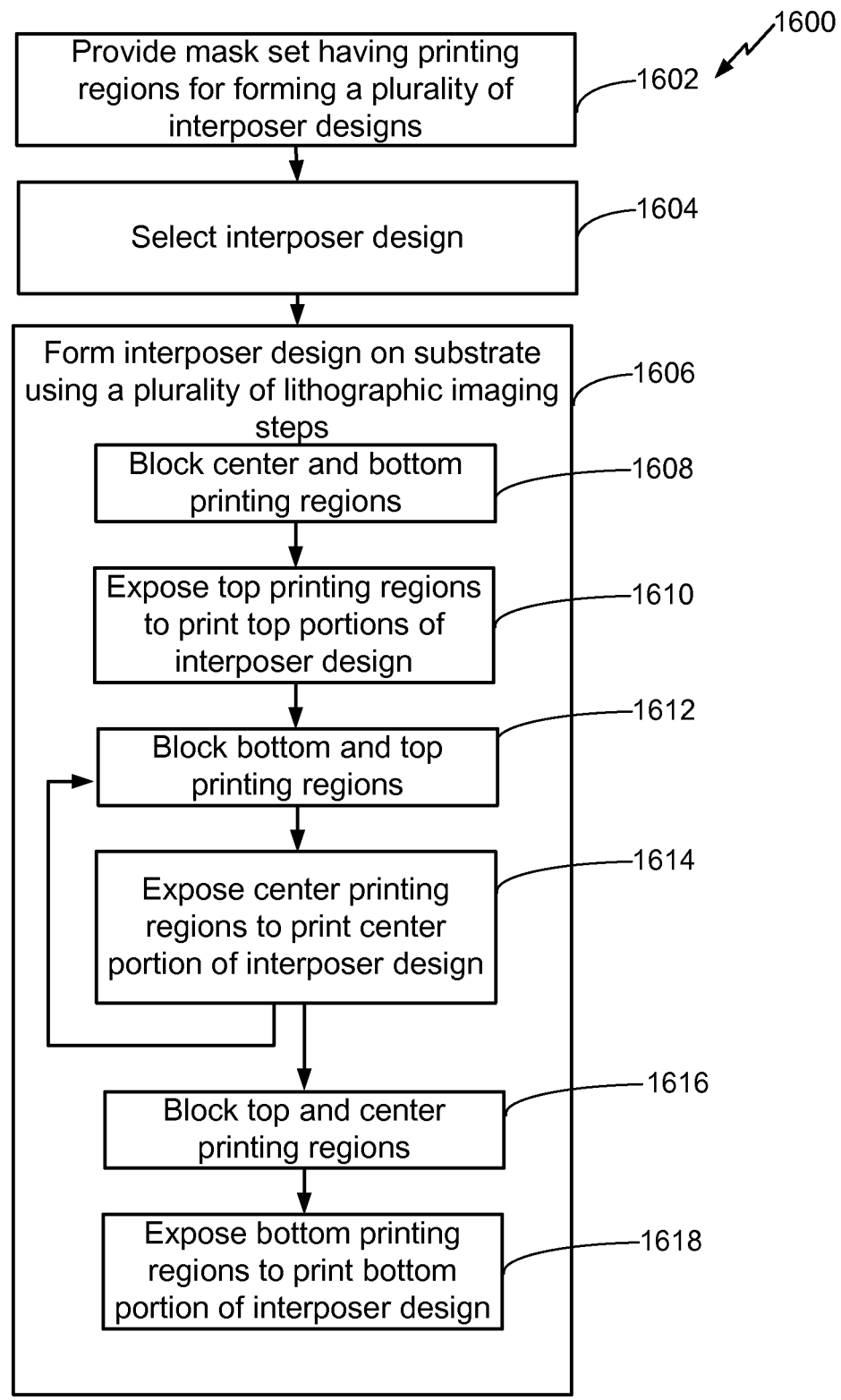
FIG. 16 is a flow diagram illustrating example lithographic imaging operations 1700 using a single mask for fabricating an interposer wafer for a device.

FIG. 16 is a flow diagram illustrating example lithographic imaging operations 1600 using a single mask for fabricating an interposer wafer for a device, according to an example implementation. The lithographic imaging operations 1600 may begin, at 1602, by providing a mask set having printing regions for forming a plurality of interposer designs (e.g., such as mask 400). At 1604, an interposer design may be selected (e.g., such as an interposer design for interposer wafer 200 or interposer wafer 300). At 1606, the selected interposer design may be formed using a plurality of lithographic imaging steps. For example, at 1608, by blocking center and bottom printing regions and, at 1610, exposing top printing region to print top portion of interposer design. At 1612, the top and bottom printing regions may be blocked and, at 1614, the center printing region may be exposed to print center portion of interposer design. In aspects, blocking 1612 and exposing 1614 may be repeated a desired number of times. Then, at 1616, the top and center printing regions maybe blocked and, at 1618, the bottom printing region may be exposed to print bottom portion of interposer design.

Figure 17:
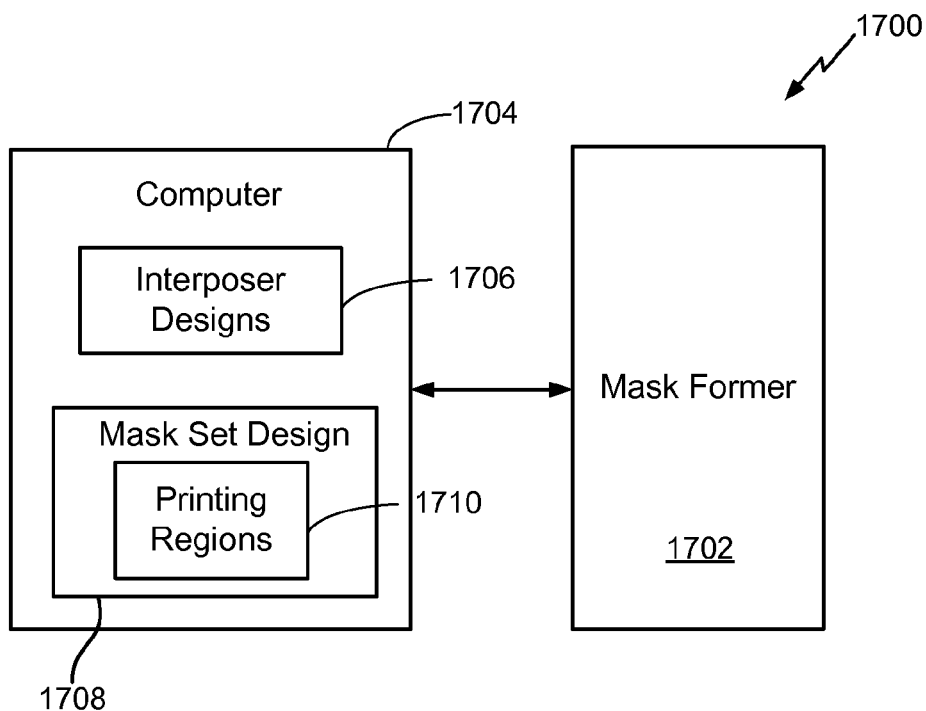
FIG. 17 is a block diagram illustrating an exemplary system.

FIG. 17 is a block diagram illustrating a system 1700, according to an example implementation. The system 1700 may include a mask former 1702. The mask former 1702 may be coupled to a computer 1704. The computer 1704 can create and store interposer designs 1706 and a mask set design 1708. The mask set design 1708 can include a plurality of printing regions 1710. The computer 1704 can generate physical implementations of the mask set design 1708 in a format accepted by the mask former 1702. The mask former 1702 can create a mask set based on the mask set design 1708, which can be used as described herein to manufacture multiple types of interposers.

Figure 18:
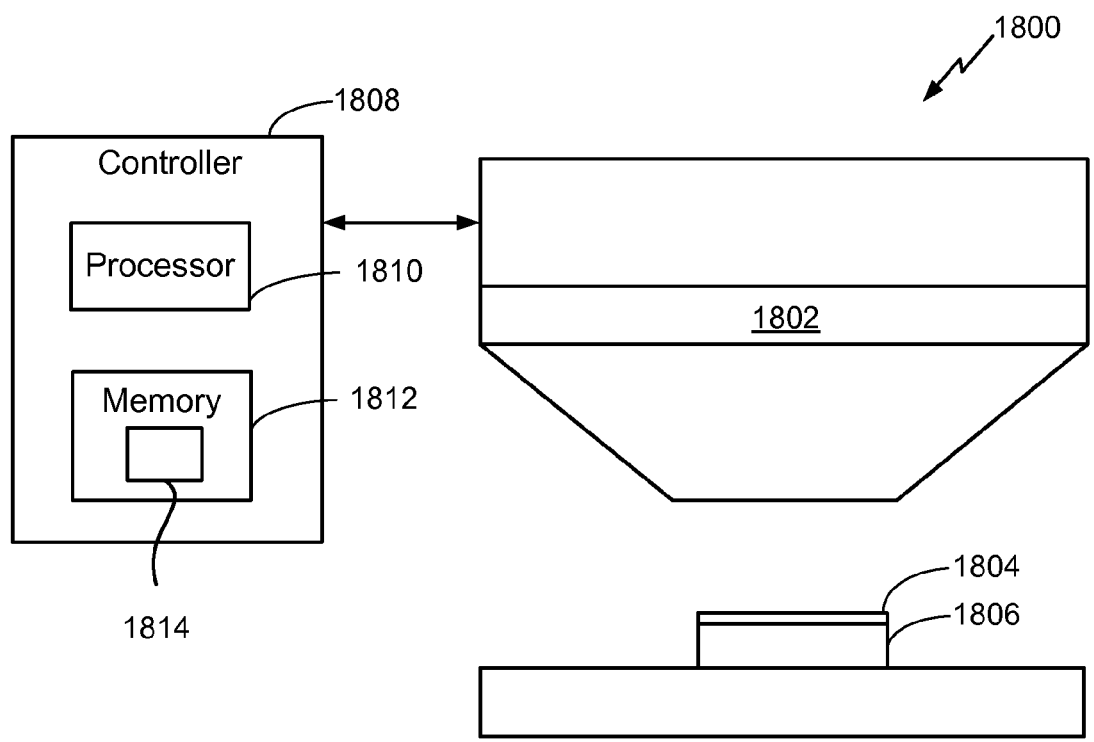
FIG. 18 is a block diagram depicting a conventional lithographic scanner.

FIG. 18 is a block diagram depicting a conventional lithographic scanner 1800, according to an example implementation. Loaded into lithographic scanner 1800 are wafer 1806 (e.g., substrate 800) and mask 1802 (e.g., similar to mask 400). Wafer 1806 may have a resist layer 1804. The lithographic scanner 1800 may be coupled to a controller 1808 that includes processor 1810 and memory 1812. The memory 1812 stores program code 1814 that, when executed by the processor 1810, causes the controller 1808 to control the lithographic scanner 1800 to perform any of the methods described above.

In some aspects, the fabricated interposer may be a passive interposer or an active interposer. In some aspects, the foregoing techniques may also apply to 3D interposer stacking schemes.

While the foregoing describes exemplary implementations, other and further implementations in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. A method of fabricating an interposer, comprising:
    providing at least one mask including a first mask, the first mask having a plurality of printing regions for forming a plurality of different interposer wafers;
    selecting one or more printing regions of the plurality of printing regions to form an interposer wafer of the plurality of different interposer wafers;
    forming the interposer wafer using a plurality of lithographic imaging steps where, for each lithographic imaging step, at least one portion of the interposer wafer is printed by exposing at least one of the selected printing regions to light while blocking at least one other of the printing regions from the light; and
    forming, using one or more of the plurality of printing regions of the first mask, a different interposer wafer using a different plurality of lithographic imaging steps.

2. The method of claim 1, wherein the printing regions include a top printing region, a center printing region, and a bottom printing region, and wherein the step of forming comprises:
    printing, in a first lithographic imaging step, a top portion of the interposer wafer by exposing the top printing region while blocking the center and bottom printing regions.

3. The method of claim 2, wherein the step of forming further comprises:
    printing, in a second lithographic imaging step, a center portion of the interposer wafer by exposing the center printing region while blocking the top and bottom printing regions.

4. The method of claim 3, wherein the step of forming further comprises:
    printing, in a third lithographic imaging step, a bottom portion of the interposer wafer by exposing the bottom printing region while blocking the top and center printing regions.

5. The method of claim 4, wherein the step of forming further comprises:
    printing, in at least a fourth imaging step, at least a second center portion of the interposer wafer by exposing the center printing region while blocking the top and bottom printing regions.

6. The method of claim 1, wherein, for each lithographic imaging step, features of at least one portion of the interposer wafer are interconnected with features of at least one other portion of the interposer wafer.

7. The method of claim 6, wherein the features comprise conductors.

8. The method of claim 6, wherein the features comprise a die seal ring.

9. A method of forming an interposer wafer comprising:
    printing, in a first lithographic imaging step, at least one portion of an interposer wafer by exposing at least one printing region of at least one mask to light while blocking at least one other printing region from the light; and printing, in a second lithographic imaging step, at least one additional portion of the interposer wafer by exposing at least one printing region of the at least one mask to light while blocking at least one other printing region from the light; wherein:

the printing regions include a top printing region, a center printing region, and a bottom printing region; and the first lithographic imaging step comprises printing a top portion of the interposer wafer by exposing the top printing region while blocking the center and bottom printing regions.

10. The method of claim 9, wherein the second lithographic imaging step comprises:

printing a center portion of the interposer wafer by exposing the center printing region while blocking the top and bottom printing regions.

11. The method of claim 10, further comprising:

printing, in a third lithographic imaging step, a bottom portion of the interposer wafer by exposing the bottom printing region while blocking the top and center printing regions.

12. The method of claim 11, further comprising:

printing, in at least a fourth lithographic imaging step, at least a second center portion of the interposer wafer by exposing the center printing region while blocking the top and bottom printing regions.

13. The method of claim 9, wherein, for each lithographic imaging step, features of at least one portion of the interposer wafer are interconnected with features of at least one other portion of the interposer wafer.

14. An apparatus configured to fabricate an interposer, comprising:

a lithographic imaging system configured to form the interposer on a substrate using at least one mask having printing regions for forming a plurality of different interposer wafers, the lithographic imaging system including a processor programmed to:

select one or more printing regions of the plurality of printing regions to form a first interposer wafer of the plurality of different interposer wafers;

form the first interposer wafer using a first plurality of lithographic imaging steps;

wherein, for each lithographic imaging step of the first plurality of lithographic imaging steps, at least one portion of the first interposer wafer is printed by exposing at least one of the selected printing regions to light while blocking at least one other of the printing regions from the light;

select one or more printing regions of the plurality of printing regions to form a second interposer wafer of the plurality of different interposer wafers; and form the second interposer wafer using a second plurality of lithographic imaging steps that are different than first plurality of lithographic imaging steps.

15. The apparatus of claim 14, wherein:

the printing regions include a top printing region, a center printing region, and a bottom printing region; and the plurality of lithographic imaging steps comprises printing, in a first lithographic imaging step, a top portion of the first interposer wafer by exposing the top printing region while blocking the center and bottom printing regions.

16. The apparatus of claim 15, wherein the plurality of lithographic imaging steps further comprises:

printing, in a second lithographic imaging step, a bottom portion of the first interposer wafer by exposing the bottom printing region while blocking the top and center printing regions.

17. The apparatus of claim 16, wherein the plurality of lithographic imaging steps further comprises:

printing, in at least a third lithographic imaging step, at least one center portion of the first interposer wafer by exposing the center printing region while blocking the top and bottom printing regions.

18. An interposer mask comprising:

a first printing region having a first image for lithographic imaging of a first circuit portion;

a second printing region having a second image for lithographic imaging of a second circuit portion;

a third printing region having a third image for lithographic imaging of a third circuit portion; and wherein the second circuit portion of the second printing region is configured to electrically connect the first and third circuit portions when imaging a first interposer, and to electrically connect a previously imaged second circuit portion and the third circuit portion when imaging a second interposer; and forming, a first light blocking region separating the first and second printing regions; and a second light blocking region separating the second and third printing regions.

* * * * *